(12) United States Patent
Hills

(10) Patent No.: US 6,583,622 B1
(45) Date of Patent: Jun. 24, 2003

(54) NMR FIELD-CYCLING SPECTROMETER IN WHICH THE SAMPLE IS CONVEYED ON A CIRCULAR PATH AT A PREDETERMINED ANGULAR VELOCITY

(76) Inventor: Brian P. Hills, 5 Taverham Chase, Taverham Norwich NR8 6NZ (GB)

(*) Notice: Subject to any disclaimer, the term of this patent is extended or adjusted under 35 U.S.C. 154(b) by 0 days.

(21) Appl. No.: 09/673,562
(22) PCT Filed: Apr. 1, 1999
(86) PCT No.: PCT/GB99/01034
§ 371 (c)(1),
(2), (4) Date: Dec. 8, 2000
(87) PCT Pub. No.: WO99/54749
PCT Pub. Date: Oct. 28, 1999

(30) Foreign Application Priority Data

Apr. 18, 1998 (GB) .............................. 9808333

(51) Int. Cl.[7] ................................. G01V 3/00
(52) U.S. Cl. ...................... 324/307; 324/309; 324/318
(58) Field of Search ............... 324/307, 318, 324/321, 322, 309, 303

(56) References Cited

U.S. PATENT DOCUMENTS 5,462,054 A * 10/1995 Rapoport et al. .......... 324/318
5,570,021 A * 10/1996 Dachniwskyj et al. ...... 324/318
5,754,048 A * 5/1998 Bielecki .................... 324/321
6,255,824 B1 * 7/2001 Barbara ..................... 324/321

OTHER PUBLICATIONS

Jerrold T. Bushberg, The essential Physics of Medical Imaging; Williams& Wilkins;pp. 717–722.*

Noak, F., NMR Field Cycling Spectroscopy: Principles and Applications, Progress in NMR spectroscopy; vol. 18, p. 171–276.*

* cited by examiner

Primary Examiner—Edward Lefkowitz
Assistant Examiner—D. Vargas
(74) Attorney, Agent, or Firm—Dickstein Shapiro Morin & Oshinsky LLP (57) ABSTRACT

A field cycling spectrometer for making nuclear magnetic resonance measurements on an object conveys the object under analysis at predetermined angular velocity successively through a first, spatially characterized, constant magnetic field $B_0$ and a second, spatially characterized, constant magnetic field $B_s$. Nuclear magnetic resonance signals are detected from the object after passing through the second field. The fields are preferably provided by a toroidal electromagnet having a first circumferential segment operable to maintain said first magnetic field level $B_0$ therein and a second circumferential segment operable to maintain said second magnetic field level $B_s$ therein.

21 Claims, 7 Drawing Sheets

NMR FIELD-CYCLING SPECTROMETER IN WHICH THE SAMPLE IS CONVEYED ON A CIRCULAR PATH AT A PREDETERMINED ANGULAR VELOCITY

The present invention relates to nuclear magnetic resonance (NMR) techniques, and in particular to field cycling spectrometry.

Field cycling relaxometry is an extremely powerful NMR technique for studying molecular dynamics within a sample or object under analysis. In field cycling, the dependence of the longitudinal relaxation time $T_1(\omega_0)$ on spectrometer frequency $\omega_0$ is typically determined over frequencies ranging from 0.01 to 10 MHz. It is called field cycling because the spectrometer frequency is related to the magnetic field strength as $\omega_0 = \gamma B_0$ where $\gamma$ is the proton gyromagnetic ratio. The frequency dependence of $T_1$ is therefore determined by rapidly cycling through different field strengths, $B_0$.

Commercial availability of field-cycling spectrometers is strictly limited at the present time. There are several reasons for this slow commercialization of field cycling spectrometers. Firstly, relaxation times can be as short as a few milliseconds, so it is necessary to be able to switch magnetic field strengths very rapidly while maintaining field homogeneity. This requires very efficient magnet cooling and a special power supply capable of delivering high power (ca. 15 kW) very rapidly. This makes such equipment both complex and expensive.

An alternative approach to field cycling is to mechanically shuffle the sample between high and low magnetic fields. This has the advantage that rapid field switching is not required. However, known applications of this idea are based on linear translation of the sample in a back-and-forth movement between magnetic fields. This is mechanically demanding and also very slow, so that short $T_1$ values cannot be measured. The NMR acquisition is also made when the sample is stationary within the magnetic fields, so that a time delay is necessary to allow mechanical vibrations to damp down before acquisition can begin.

The present invention seeks to provide a field cycling NMR spectrometer which overcomes some or all of the problems of the prior art as enumerated above.

According to one aspect, the present invention provides an apparatus for making nuclear magnetic resonance measurements on an object, comprising:

means for conveying the object under analysis, at predetermined angular velocity, successively through a first, spatially characterized, constant magnetic field $B_0$ and a second, spatially characterized, constant magnetic field $B_s$; and means for detecting nuclear magnetic resonance signals weighted with at least one nuclear magnetic resonance parameter from said object.

According to a further aspect, the present invention provides a method of making nuclear magnetic resonance measurements on an object under analysis, comprising the steps of:

rotating the object at a first predetermined angular velocity about a point so that the object is repeatedly conveyed along a circular path, which circular path sequentially passes through a first magnet having a first, spatially characterized, constant field strength $B_0$ and a second magnet having a second, spatially characterized, constant field strength $B_s$; and detecting nuclear magnetic resonance signals weighted with at least one nuclear magnetic resonance parameter from said object after said at least part of an object passes through said second magnet.

Embodiments of the present invention will now be described, by way of example, and with reference to the accompanying drawings in which.

The invention described herein differs fundamentally from previous approaches to field cycling in that the NMR measurements are not made on a stationary sample, but instead when the sample is undergoing steady circular motion. This has a number of advantages.

Firstly, rapid field switching during measurement is not necessary because measurements can be made in a steady state when the fields are kept constant and homogeneous.

Secondly, the sample moves with a constant velocity through the field and so does not experience time-dependent mechanical forces or vibrations.

Thirdly, short relaxation times can be measured simply by increasing the sample velocity (subject to limitations described below).

Fourthly, the design is simple and low cost and therefore can be readily commercialised.

A fifth advantage is that with the minor addition of a field gradient coil, the spatially resolved field-dependent relaxation time can be obtained in the same apparatus.

A preferred embodiment of an NMR spectrometer 1 according to the present invention is now described with reference to FIGS. 1 to 4.

Figure 1:
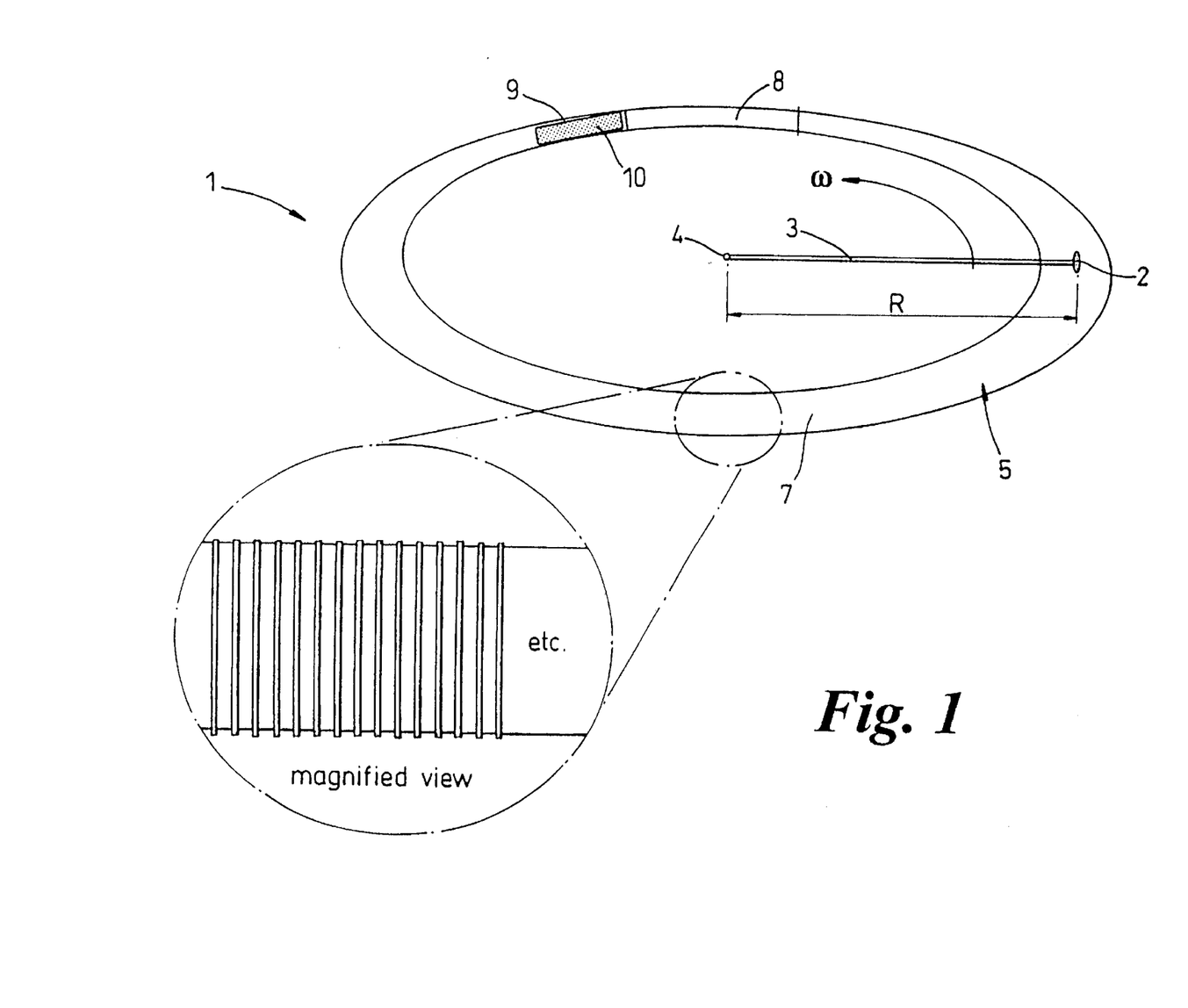
FIG. 1 shows a schematic view of a cyclic field-cycling spectrometer according to a preferred embodiment of the present invention.

A sample 2 to undergo analysis is fixed at the end of a rotor arm 3, of length R, which rotates about a pivot 4 at a controlled angular velocity $\omega$. The distal end (ie. sample end) of the rotor arm 3 is located inside a cylindrical electromagnet 5 which extends longitudinally around a circular path like a doughnut ring. We shall describe this as a toroidal electromagnet or solenoid. By virtue of the rotor arm 3 positioning, the sample 2 is located on or close to a tangential central axis of the electromagnet 5 at any given circumferential position within the electromagnet. To make this possible, the toroidal solenoid 5 has a small slit 20 extending circumferentially around the inside face, having a slit height sufficient to allow the rotor arm to extend into the toroid and rotate therein. This is shown in FIG. 2, which illustrates a circumferential portion of the toroidal solenoid, viewed from the centre of the toroid.

Figure 2:
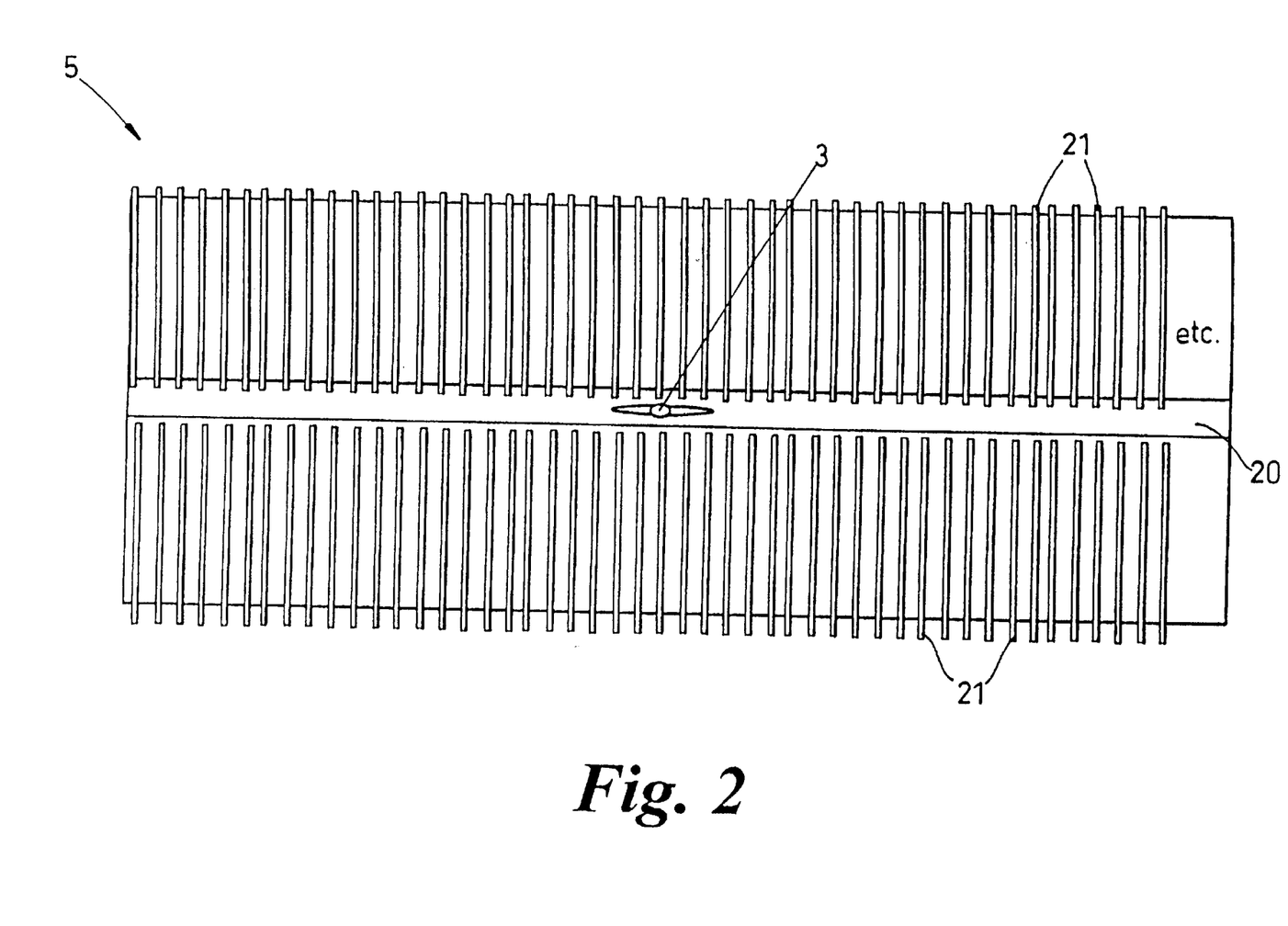
FIG. 2 shows a schematic view of a portion of a solenoid ring of FIG. 1, viewed from the centre of the ring.
Figure 3:
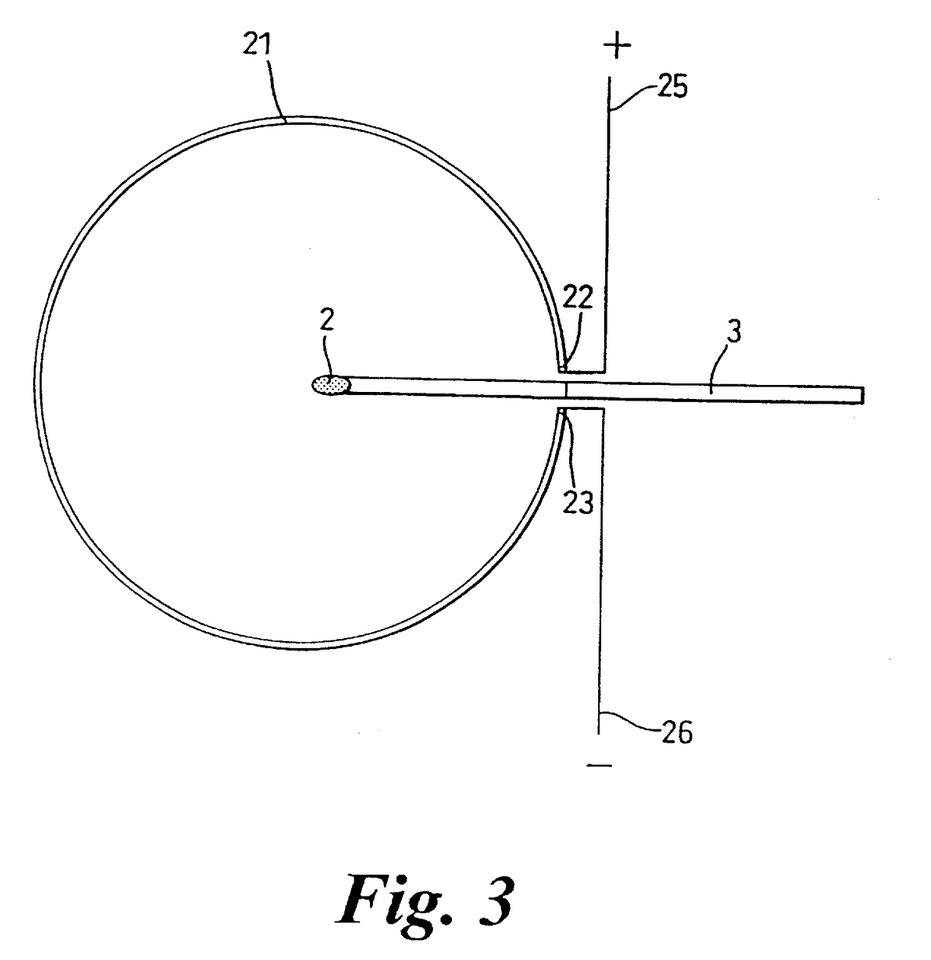
FIG. 3 shows a schematic cross-sectional view through a part of the solenoid ring of FIGS. 1 and 2.

To facilitate the circumferential slit, the turns 21 of the solenoid are preferably not formed as a continuous helical coil, but are discrete adjacent turns of slightly less than 360° as indicated in FIGS. 2 and 3. Current is supplied to each coil turn 21 from a positive terminal 25, to is the start of the turn, adjacent the upper edge 22 of the slit 20. Current travels around the respective turn 21 to the lower edge 23 of the slit 20, and then to a negative terminal 26.

Preferably, such a series of coil turns are formed by printed circuit electrically conductive elements on a flexible laminate which is wrapped around a toroidal former. Other techniques are available in the art.

With further reference to FIG. 1, the toroidal solenoid 5 is also circumferentially split into large and small segments 7, 8 and 9. The large first segment 7, of length $L_0$, carries a constant electric current sufficient to create a substantially uniform magnetic field $B_0$ inside the solenoid 5 over the length $L_0$. The direction of $B_0$ is preferably around the toroid; in other words, the direction of $B_0$ describes a circle so that at any given point in the circumference of tie toroid, $B_0$ is orthogonal to the plane of the solenoid coil turn at that point, and therefore tangential to the circle defining the coil "centre". A smaller second segment 8, of length $L_s$, also carries a constant electric current sufficient to create a magnetic field $B_s$ which need not necessarily be the same magnitude as $B_0$, but which has the same circular directionality as $B_0$ described above. The field strengths $B_0$ and $B_s$ can be altered independently of one another by altering the currents through each of the first and second segments 7 and 8 independently. It will be understood that minor variations in the magnetic field strengths $B_0$ and $B_s$ arising from a slight divergence of the coil turns as they radiate outward from the centre of the toroid can be accommodated in the methods described herein.

If $B_0$ differs from $B_s$, the time $t_0$ which the sample spends in the field $B_0$ is equal to $L_0/\omega R$ and the time $t_s$ spent ill the field $B_s$ is $L_s/\omega R$. These times $t_0$ and $t_s$ can therefore be altered by changing the angular velocity $\omega$ of the rotor arm and sample. Longer times can be obtained in either field by setting $B_0$ equal to $B_s$ and allowing the sample to undergo n revolutions around the toroidal electromagnet 5. The time spent in the constant field $B_0$ (=$B_s$) is then obviously $2\pi n/\omega$.

To detect an NMR free induction decay from the sample, a specially designed, cylindrical radiofrequency solenoid coil 10, which we call the "RF unit", is situated inside the toroidal electromagnet 5 occupying a portion of the first segment 7 immediately adjacent the second segment. We shall refer to this portion of the solenoid containing the RF unit as the third segment 9. The RF unit 10 also acts as a receiver coil and is fully described in the reference, "A solenoid-like coil producing transverse radiofrequency fields for MR imaging" by E. K. Jeong, D. H. Kini, M. J. Kim, S. H. Lee, J. S. Suh and Y. K. Kwong in J. Magn. Reson. 127 (1997) 73–79. Article no. MN971172. Full details of the construction of such a coil are found therein.

The radiofrequency solenoid coil 10 is situated inside and concentrically with the $B_0$ electromagnet 5 (ie. occupying large segment 7 of the toroid), just after the small $B_s$ solenoid in small segment 8.

Figure 4:
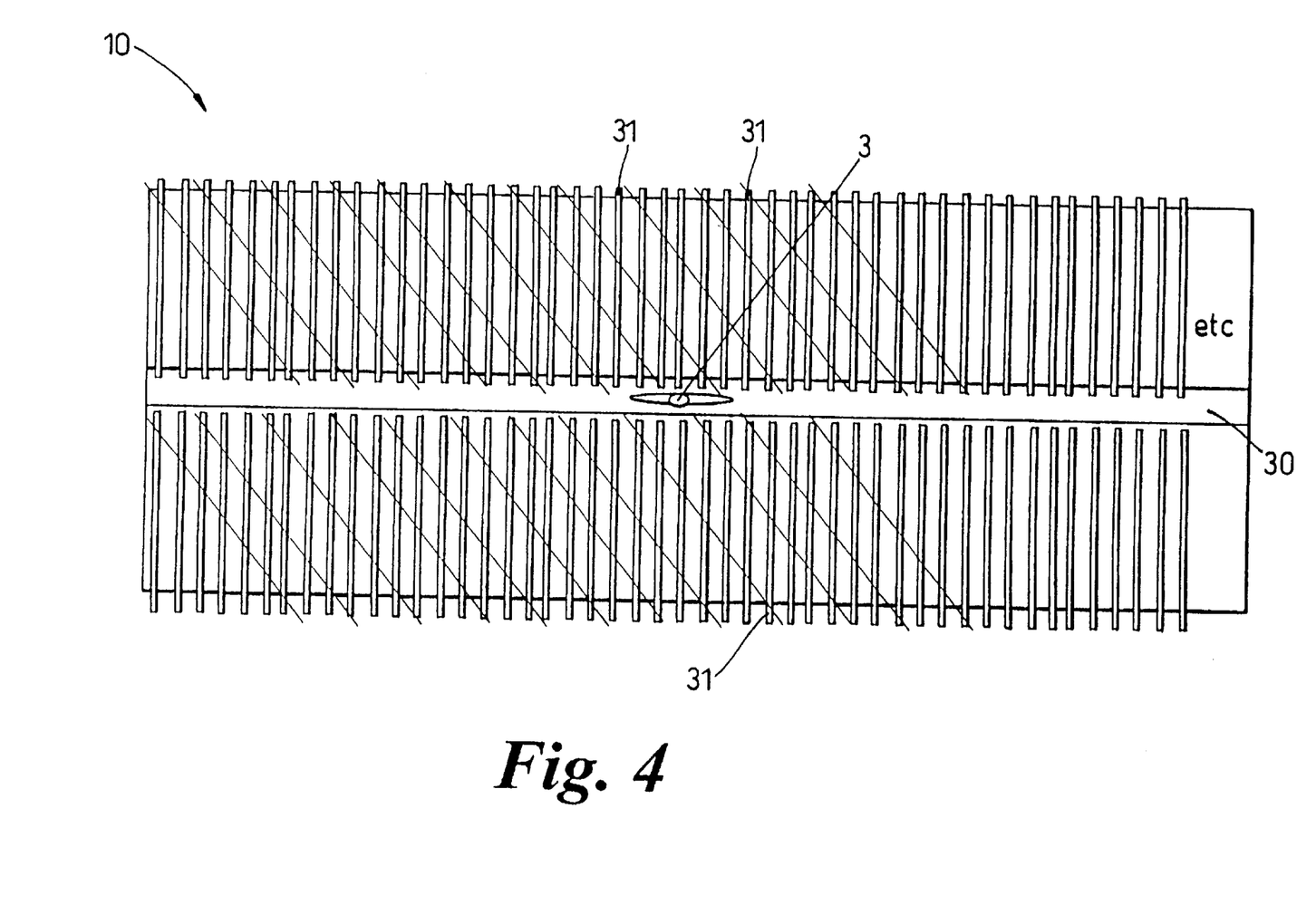
FIG. 4 shows a schematic view of a portion of an RF coil of FIG. 1, viewed from the centre of the solenoid ring.

To permit the rotor arm 3 free movement, a small slit 30 needs to be cut into the RF unit 10 as indicated in FIG. 4, in similar manner to that described for the $B_0$ large segment 7 (FIG. 2).

The RF unit 10 is interfaced with conventional electronic equipment and computers for control, acquisition and data processing.

The RF unit (third) segment 9 therefore includes a pair of cylindrical coils: the outer coil being the toroidal electromagnet 5 and an inner coil which has the plane of each turn 31 tilted with respect to the cylinder (tangential) axis to generate an RF field with a component orthogonal to the $B_0$ field, ie. perpendicular to the tangential axis at any given point in the circumference of the toroidal solenoid. A further, inner coil (not shown) may act as an eddy-current coil to eliminate the longitudinal (ie. circumferential) component of the RF field, leaving an RF field entirely perpendicular to the cylinder axis.

Further details of the RF unit 10 construction and operation are to be found in co-pending UK patent application number 9801622.3.

Field Cycling Pulse Sequences

Figure 6:
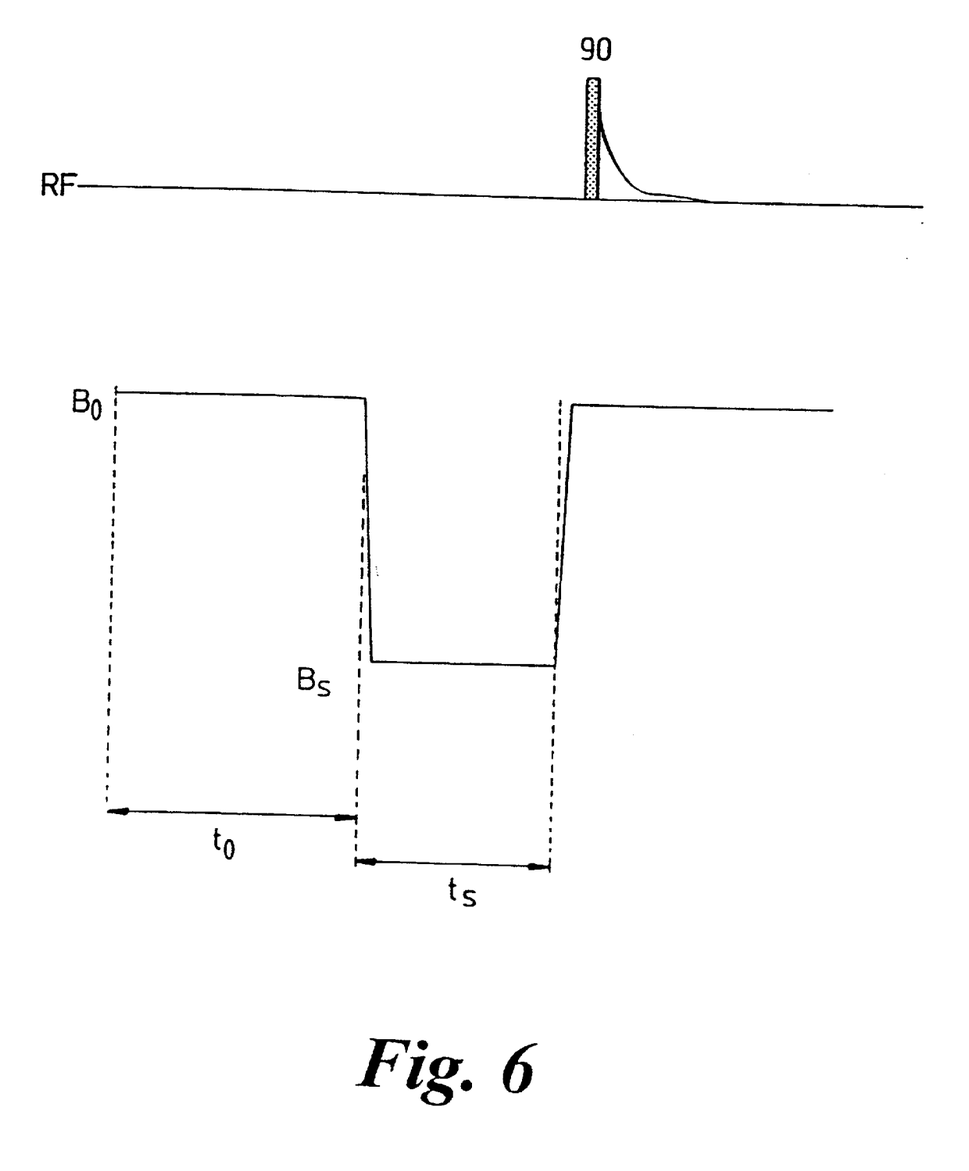
FIG. 6 shows an exemplary basic field-cycling pulse sequence of the present invention.

A typical field cycling pulse sequence is shown in FIG. 6. This can be implemented on the cyclic field-cycling spectrometer in three modes: the dynamic mode, the steady-state mode or the transient mode.

The Dynamic Mode

This is conceptually the simplest scheme since it corresponds closely to the pulse sequence in FIG. 6. However it also involves field switching $B_s$ of the small segment during a revolution of the rotor arm 3, so it is only suitable if the switching time is less than the time $t_0$ spent in the field $B_0$ in the large segment. The dynamic acquisition mode involves the following steps:

1. The field $B_s$ is first set equal to the field $B_0$ which is the measuring field (typically 5–10 MHz).
2. The sample is rotated at the highest angular velocity $\omega_{max}$ in the constant field $B_0$. The velocity $\omega_{max}$ is determined by the desired minimum time $t_{min}$ during which the sample is to relax in the low field $B_s$. The time $t_{min}$ is $L_s/\omega_{max}R$.
3. Once the sample is fully polarized in the $B_0$ field (which requires a time greater than $5T_1(\omega_0)$, the field in the small segment is lowered to the desired field $B_s$. This lowering of the field is performed in the time the sample is in the large segment, ($L_0/\omega R$. A free induction decay is acquired with a 90 degree pulse generated by the RF unit 10 as the sample exits the small segment 8 and enters the RF unit segment 9. The 90° pulse can be triggered, for example, by an electronic switch activated when the rotor cuts a light beam.
4. If the signal-to-noise ratio is low, then steps 1 to 3 can be repeated to obtain signal accumulations.
5. The time spent in the field $B_s$ is then progressively incremented by repeating steps 1 through 4 at progressively lower angular velocities $\omega$.
6. The longitudinal relaxation time $T_1$ is obtained by fitting the FID intensity $S(t_s)$ as:

$$S(t_s)=S(t_s=0)\exp\{-t_s/T_1(B_s)\}.$$

7. The field-dependence of $T_1$ can be determined by repeating steps 1 through 6 with decreasing $B_s$.

The time $t_0$ preferably needs to be longer than the minimum time required to switch the field in the short segment from $B_0$ to $B_s$. This places limits on the minimum relaxation time that can be measured.

For example, if the minimum relaxation time $T_s$ is 10 ms, then the minimum value of $t_s$ is preferably also 10 ms, to give about 5 points on the decay envelope. But $t_s=L_s/\omega_{max}R$. If R=50 cm and $L_s$=15 cm, $2\pi R$=314.15 cm, so that $L_0$=299.16 cm. Then $\omega_{max}=L_s/Rt_{s,min}$, $$\omega_{max}=L_s/Rt_{s,min}=15/50\times0.01=30s^{-1}$$

This corresponds to $\omega_{max}/2\pi$=approximately 5 revolutions per second.

The switching time for the solenoid is then:

$$t(\text{switch}) = L_0/\omega_{max}R = 200 \text{ msec}$$

which is well within the reach of available apparatus.

The Steady-state Mode

The problem of rapid field switching can be removed by undertaking all measurements in the steady state. $B_0$ and $B_s$ are kept constant (and different from one another) and the sample is rotated at a steady angular velocity. The theory for the steady state is developed in Appendix I where it is shown that the steady-state signal $M_{min}$, measured at $B_0$ in the RF unit just after the sample leaves the small segment 8, is given by:

$$M_{min} = \{M_s[1-\exp(-t_s/T_s)] + M_0 \exp(-t_s/T_s)[1-\exp(-t_0/T_0)]\}/[1-\exp(-t_0/T_0-t_s/T_s)]$$

where $t_s/t_0 = L_s/L_0$.

$M_0$ and $T_0$ can be measured with a stationary sample in the RF unit 10 with a standard inversion recovery or saturation recovery sequence before commencement of the spectroscopic analysis of the sample. A single measurement of $M_{min}$ at known angular velocity therefore serves to determine $T_s$.

To establish a steady state, it is preferable that $t_0$ is sufficiently long compared with $T_0$ to permit significant recovery of magnetization during one passage through the large segment $L_0$. This requires that $t_0 \geq T_0$. This, in turn, sets a minimum value on $t_s$ because $t_s = L_s t_0/L_0$. The problem therefore arises that if $t_s \geq T_s$ then $M_{min}$ approaches $M_s$, and the method breaks down. This shows that for the steady state to be of value, $$T_0 \leq t_0 \leq L_0 T_s/L_s$$

In practice $L_s \approx L_0/10$, so $T_s$ should preferably not be less than 0.1 $T_0$ for the steady state method. If this condition is not fulfilled then $T_0$ can be reduced by lowering $B_0$, at the expense of poorer signal-to-noise ratio. Alternatively, the transient acquisition mode can be used, as will now be described.

The Transient Mode

The limitations in the dynamic mode (the switching time) and in the steady state mode (the recovery time, $t_0$) can both be circumvented in the transient mode by measuring the decay of magnetization in each rotation after the field in the short segment 8 has been switched from $B_0$ to a lower field $B_s$. If the time required for the field to reach $B_s$ is longer than $t_0$, eg. $n \times t_0$, then the signal recorded from the first n revolutions is simply ignored, and only the points from the (n+1)th revolution onwards are used to measure $T_s$.

In order to permit a measurement from each revolution it is necessary to restore the longitudinal magnetization after the acquisition in the RF unit. This can be done with a $90_x - \tau - 180_y - \tau - 90_{-x}$ pulse sequence, where the acquisition is taken after the first 90° pulse. The degree to which the magnetization is restored in this sequence can be measured at the start of the experiment by setting $B_s = B_0$, and observing the signal from successive revolutions.

The theory of the transient mode is developed in Appendix 2 where it is shown that the signal $M_n$ acquired on the nth revolution is related to that in the previous revolution, $M_{n-1}$ as, $$M_n = M_s[1-\exp(-t_s/T_s)] + M_0 \exp(-t_s/T_s)[1-\exp(-t_s-t_0)/T_0)] + M_{n-1}\exp(-t_s/T_s)\exp(-t_s-t_0)/T_0)]$$

Here, $M_0$ is the equilibrium starting magnetization in $B_0$ before the field is switched and $M_s$ is the final equilibrium magnetization in the lower field $B_s$. Because $M_0$, $M_s$, $t_s$, $t_0$ and $T_0$ are all known (or can be measured separately) this enables $T_s$ to be determined from measurements of $M_n$ and $M_{n-1}$.

Unlike the steady state method, the transient method places no restrictions on $T_0$. If $T_0$ is very long, so that $t_0 \ll T_0$, and such that there is no recovery in the large segment, then the above equation reduces, in this limit, to, $$M_n = M_s[1-\exp(-t_s/T_s)] + M_{n-1}\exp(-t_s/T_s).$$

The first term is a small constant (zero if $M_s$ is negligibly small), so $T_s$ is obtained from an exponential decay.

Small Tip Angle Acquisition

As an alternative to the $90_x - \tau - 180_y - \tau - 90_{-x}$ pulse sequence for restoring longitudinal magnetization, small tip angle excitation can be used. A θ° excitation pulse gives a signal proportional to $M.\sin\theta$ and a residual longitudinal magnetization of $M.\cos\theta$. If θ is 30°, this is sufficient for at least 10 points on the decay. The residual transverse magnetization can be destroyed with a spoiler gradient after the RF unit if necessary.

Additional Hardware Considerations

Figure 5A:
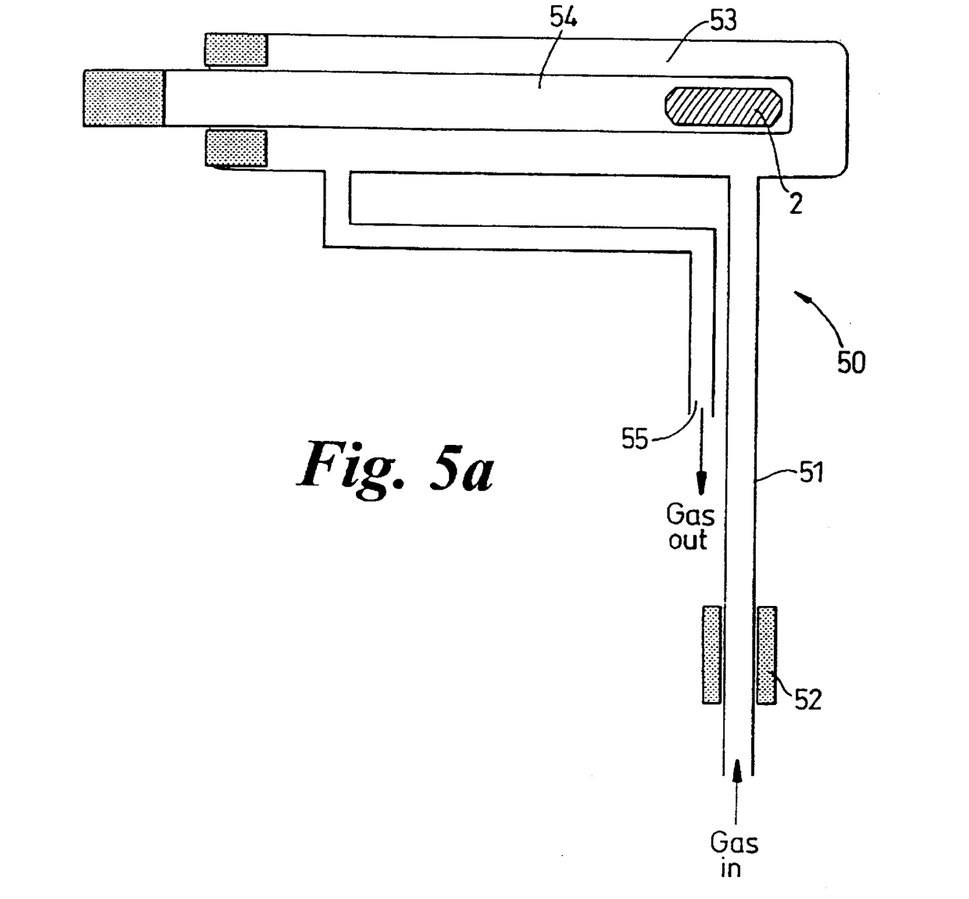
FIGS. 5a and 5b show a schematic side view of a preferred sample holder of the spectrometer of FIG. 1.

The sample can be temperature controlled by the passage of dry cooled, or heated nitrogen gas over the sample. One possible arrangement is shown in FIG. 5 which shows, in FIG. 5a, a top view of a rotor 50. The rotor 50 includes a hollow rotor arm 51 through which gas can be delivered through a rotating seal (not shown) on the rotor axis, and a lo hollow screw joint 52. The gas is passed down the centre of the rotor arm 51 which comprises a hollow, insulated tube to a jacket 53 which substantially surrounds a sample tube 54. The gas passes over the sample tube 54 to an outlet which may be a simple exhaust 55, or a return path via the rotor arm 51 through the rotating seal (not shown).

Figure 5B:
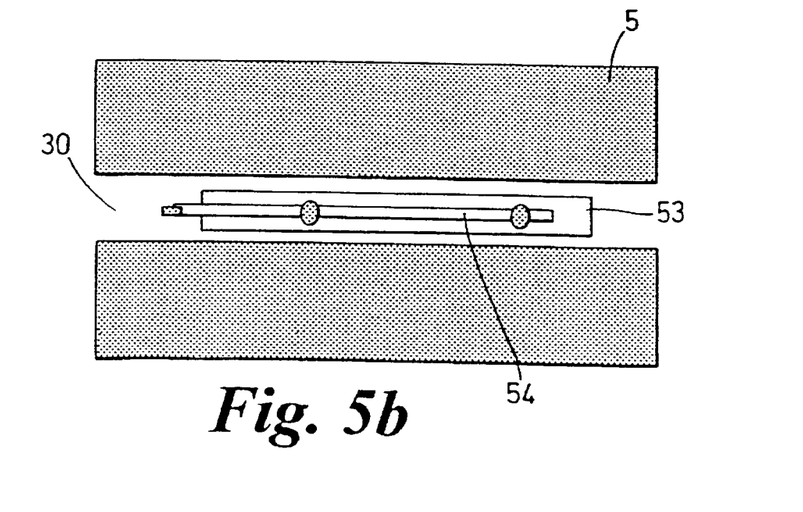

One possible arrangement for changing the samples is also indicated in FIG. 5b, which is a side view of a segment of the toroidal solenoid, viewed from the centre of the toroid. The sample tube 54 fits inside the jacket 53 and the jacket attaches to the rotor via the hollow screw 52. Removing the sample means unscrewing the rotor arm 51 from the rotor, moving the rotor out of the way and removing the rotor arm 51, jacket 53 and sample tube 54 from the solenoid through the slit 30. This requires that the sample holder (jacket 53) is slightly less in width than the slit in the inner side of the solenoid.

Of course, it will be understood that other methods of rotating the sample through the toroidal electromagnet are possible. The slit 30 need not be on the inside edge of the toroid: equally it could be provided on the top, bottom or outside edge of the toroidal electromagnet according to preference. For a top or bottom slit, insertion of the sample can be by a simple up and down movement of the entire rotor, rotor arm and sample holder.

It will be understood that, in the apparatus described above, wherever a constant magnetic field component is required, this could alternatively be provided either fully, or in part, by a permanent magnet or permanent magnet array, rather than by the electromagnets described. For example, at least the large segment 7 of the toroidal solenoid could be replaced by a suitable configured permanent magnet.

APPENDIX 1

Theory of the Steady-state Acquisition Mode

Figure 7:
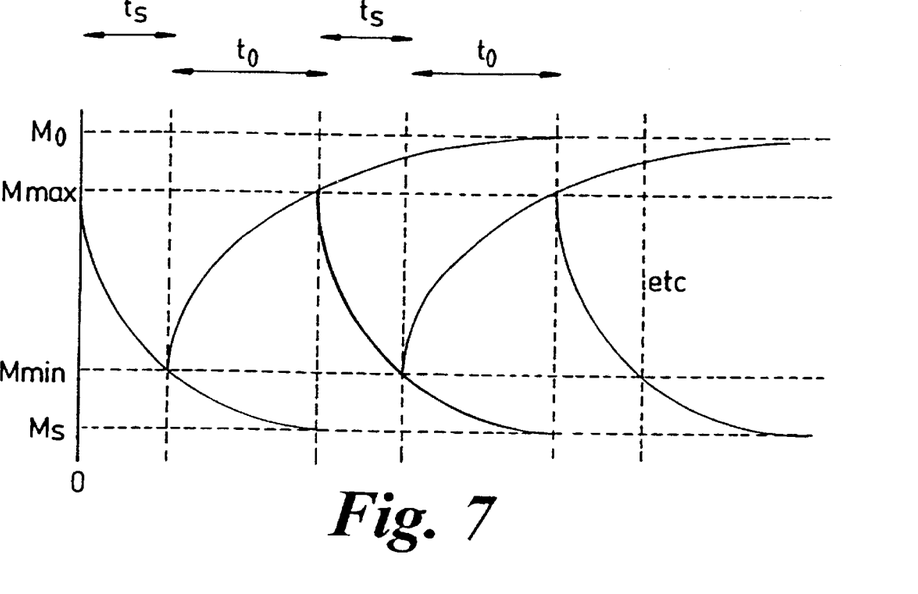
FIG. 7 shows a graph indicating the time evolution of magnetization in a sample in the field-cycling spectrometer of FIG. 1.

FIG. 7 shows the time evolution of the magnetization during a steady-state experiment.

During the time the sample is in the small segment 8, at field strength $B_s$, the longitudinal magnetization $T_1$ decays from $M_{max}$ to $M_{min}$ in the time $t_s$. During the time the sample is in the large segment 7 in the field strength $B_0$, the magnetization recovers from $M_{min}$ to $M_{max}$.

During time 0 to $t_s$, the magnetization evolves as $$M(t)=M_s+(M_{max}-M_s)\exp(-t/T_s) \quad [1]$$

Therefore $M_{min}$ is given when $t=t_s$:

$$M_{min}=M_s+(M_{max}-M_s)\exp(-t_s/T_s) \quad [2]$$

During time $t_s$ to $(t_s+t_0)$, the magnetization evolves as $$M(t)=M_0-(M_0-M_{min})\exp[-(t-t_s)/T_0] \quad [3]$$

Therefore $M_{max}$ is given when $t=(t_s+t_0)$:

$$M_{max}=M_0-(M_0-M_{min})\exp(-t_0/T_0) \quad [4]$$

For a steady-state situation, $M_{max}$ and $M_{min}$ are constants, independent of time. Substituting [4] into [2], and solving for $M_{min}$ gives, $$M_{min}=\{M_s[1-\exp(-t_s/T_s)]+M_0\exp(-t_s/T_s)[1-\exp(t_0/T_0)]\}/[1-\exp(-t_0/T_0-t_s/T_s)]$$

where $t_s/t_0=L_s/L_0$.

$M_0$ and $T_0$ can be measured in a standard inversion-recovery or saturation recovery sequence on the stationary sample in the RF unit. $M_s$ can be measured on a stationary sample in the RF unit with $B_0$ turned down to $B_S$ (and may well be negligible or immeasurably small). $t_0$ and $t_s$ are known, so a single measurement of $M_{min}$ gives $T_s$.

APPENDIX 2
Theory of the Transient Acquisition Mode

Figure 8:
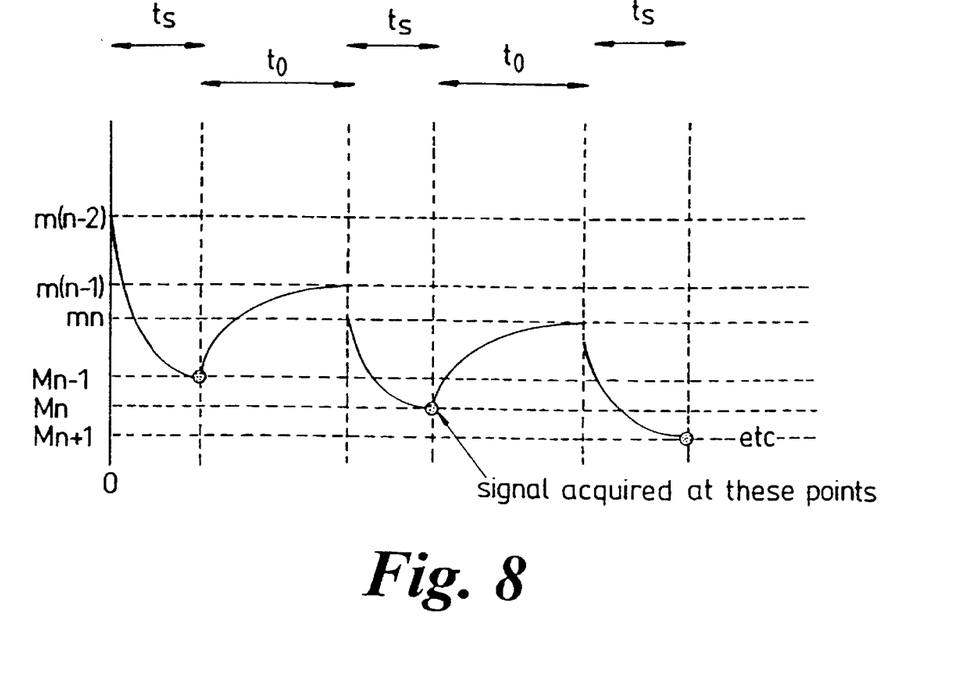
FIG. 8 shows a graph indicating the time evolution of longitudinal magnetization in a sample during the transient acquisition mode.

The time evolution of the longitudinal magnetization during the transient acquisition mode is shown in FIG. 8.

During the decay step, $$M_n=M_s+(m_{n-1}-M_s)\exp-\{[t-(n-1)t_s-(n-1)t_0]/T_s\}, n\geq 1 \quad [1]$$

Where $m_0=M_0$, the equilibrium magnetization in the $B_0$ field. But the measurement times are given as $$t=nt_s+(n-1)t_0 \quad [2]$$

Therefore $$M_n=M_s+(m_{n-1}-\exp-\{t_s/T_s\}, n\geq 1. \quad [3]$$

During the recovery step, $$m_{n-1}=M_0+(M_{n-1}-M_0)\exp-\{[t-(n-1)t_s-(n-2)t_0]/T_0), n\geq 1. \quad [4]$$

But the time t when $m_{n-1}$ is stopped is $$t=nt_s+(n-1)t_0 \quad [5]$$

Therefore $$m_{n-1}=M_0+(M_{n-1}-M_0)\exp-\{[t_s+t_0]/T_0\}, n>1. \quad [6]$$

Substituting [6] into [3] gives, $$M_n=M_s\{1-\exp(-t_s/T_s)\}+M_0\exp(-t_s/T_s)[1-\exp\{(-t_s-t_0)/T_0\}]+M_{n-1}\exp-(t_s/T_s)\exp-[(t_s+t_0)/T_0] \quad [7]$$

which is the equation quoted in the text.
The Iterated Expression
Equation [7] can be written in the form, $$M_n=AM_{n-1}+B \quad [8]$$

where A and B are constants given as, $$A=\exp-(t_s/T_s)\exp-[(t_s+t_0)/T_0] \quad [9]$$

$$B=M_s\{1-\exp(-t_s/T_s)\}+M_0\exp(-t_s/T_s)[1-\exp\{(-t_s-t_0)/T_0\}] \quad [10]$$

Iterating, $$M_{n-1}=AM_{n-2}+B$$

$$M_{n-2}=AM_{n-3}+B \ldots \text{etc.}$$

Substituting into [8] it follows that the nth data point is related to the mth point (n>m) as, $$M_n=A^m M_{n-m}+B\Sigma_{i=1}^m A^{m-i} \quad [11]$$

and, if m=n, $$M_n=A^n M_0+B\Sigma_{i=1}^n A^{n-i} \quad [12]$$

where $$A^n=\exp-(nt_s/T_s)\exp-[n(t_s+t_0)/T_0] \quad [13]$$

What is claimed is:

1. Apparatus for making nuclear magnetic resonance measurements on an object, comprising:
   means for conveying the object under analysis, at predetermined angular velocity, successively through a first, spatially characterized, constant magnetic field $B_0$ and a second, spatially characterized, constant magnetic field $B_s$; and
   means for detecting nuclear magnetic resonance signals weighted with at least one nuclear magnetic resonance parameter from said object.

2. Apparatus according to claim 1 further including a toroidal magnet having a first circumferential segment operable to maintain said first, spatially characterized, constant magnetic field strength $B_0$ therein and a second circumferential segment operable to maintain said second, spatially characterized, constant magnetic field strength $B_s$ therein.

3. Apparatus according to claim 2 wherein said toroidal magnet includes an electromagnet in at least said second circumferential segment.

4. Apparatus according to claim 3 wherein said second segment is switchable between a plurality of different field strengths therein.

5. Apparatus according to claim 1 wherein said means for conveying includes a rotor arm extending into said toroidal magnet through a circumferential slit in the toroid.

6. Apparatus according to claim 5 further including means for controlling and varying the angular velocity of the rotor arm.

7. Apparatus according to claim 5 wherein said slit extends around the inner face of the toroidal magnet.

8. Apparatus according to claim 2 wherein said means for detecting includes means for generating a radiofrequency field $B_1$ transverse to the field $B_0$ in a third segment of said toroidal magnet.

9. Apparatus according to claim 8 wherein said third segment forms a part of said first segment proximal to the boundary of the first segment with said second segment.

10. Apparatus according to claim 5 wherein said toroidal magnet comprises an electromagnet having a plurality of substantially parallel turns of electrically conductive material extending around the surface of the toroidal form from either side of said slit.

11. Apparatus according to claim 1 wherein the means for conveying the object further include temperature control means for controlling the temperature of said object under analysis.

12. A method of making nuclear magnetic resonance measurements on an object under analysis, comprising the steps of:

rotating the object at a first predetermined angular velocity about a point so that the object is repeatedly conveyed along a circular path, which circular path sequentially passes through a first magnet having a first, spatially characterized, constant field strength $B_0$ and a second magnet having a second, spatially characterized, constant field strength $B_s$; and detecting nuclear magnetic resonance signals weighted with at least one nuclear magnetic resonance parameter from said object after at least part of said object passes through said second magnet.

13. A method according to claim 12 further including the step of providing the circular path within a segmented toroidal electromagnet such that a first segment of the toroid provides said first, spatially characterized, constant field strength $B_0$ and a second segment provides said second, spatially characterized, constant field strength $B_s$.

14. A method according to claim 13 further including providing a third segment with an RF field orthogonal to said first and second fields.

15. A method according to claim 14 further including the steps of:

a) setting the field strength $B_0 = B_s$ and rotating said object through said first and second electromagnets more than once in succession;

b) while the object is travelling through said first electromagnet, switching said second electromagnet to a different field strength $B_s$ not equal to $B_0$;

c) continuing rotation of the object through said second electromagnet; and d) detecting nuclear magnetic resonance signals from said object.

16. A method according to claim 15 further including the steps of:

repeating the steps a) to d) for successive different values of angular velocity of the object around the circular path.

17. A method according to claim 14 further including the steps of:

setting the field strength $B_s$ not equal to $B_0$ and rotating said object successively through said first and second electromagnets;

substantially polarizing the object while it is travelling through said first electromagnet;

continuing rotation of the object through said second electromagnet; and detecting nuclear magnetic resonance signals from said object.

18. A method according to claim 14 further including the steps of:

setting the field strength $B_0 = B_s$ and rotating said object through said first and second electromagnets more than once in succession;

while the object is travelling through said first electromagnet, switching said second electromagnet to a different field strength $B_s$ less than $B_0$;

continuing rotation of the object through said first and second electromagnets; and detecting nuclear magnetic resonance signals from said object only after a predetermined number of rotations of the object around said circular path after said switching.

19. Apparatus according to claim 4 wherein said means for conveying includes a rotor arm extending into said toroidal magnet through a circumferential slit in the toroid.

20. Apparatus according to claim 19 further including means for controlling and varying the angular velocity of the rotor arm.

21. Apparatus according to claim 20 wherein said means for detecting includes means for generating a radiofrequency field $B_1$ transverse to the field $B_0$ in a third segment of said toroidal magnet.

* * * * *